United States Patent
Zhong et al.

(10) Patent No.: US 10,014,460 B2
(45) Date of Patent: Jul. 3, 2018

(54) FLIP-CHIP HIGH-VOLTAGE LIGHT EMITTING DEVICE AND FABRICATION METHOD

(71) Applicant: XIAMEN SANAN OPTOELECTRONICS TECHNOLOGY CO., LTD., Xiamen (CN)

(72) Inventors: Zhibai Zhong, Xiamen (CN); Yen-chih Chiang, Xiamen (CN); Qiuyan Fang, Xiamen (CN); Chia-en Lee, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 4 days.

(21) Appl. No.: 15/418,774

(22) Filed: Jan. 29, 2017

(65) Prior Publication Data
US 2017/0141280 A1  May 18, 2017

Related U.S. Application Data

(63) Continuation of application No. PCT/CN2015/078570, filed on May 8, 2015.

(30) Foreign Application Priority Data

Dec. 8, 2014  (CN) .......................... 2014 1 0735775

(51) Int. Cl.
*H01L 33/64* (2010.01)
*H01L 25/075* (2006.01)
(Continued)

(52) U.S. Cl.
CPC ........ *H01L 33/647* (2013.01); *H01L 25/0753* (2013.01); *H01L 33/44* (2013.01);
(Continued)

(58) Field of Classification Search
CPC ... H01L 33/647; H01L 33/62; H01L 25/0753; H01L 33/502; H01L 33/44; H01L 33/60;
(Continued)

(56) References Cited

U.S. PATENT DOCUMENTS

| | | | | |
|---|---|---|---|---|
| 2009/0267085 A1* | 10/2009 | Lee | ........................... | F21K 9/00 257/88 |
| 2012/0286240 A1* | 11/2012 | Yu | ....................... | H01L 25/0753 257/13 |
| 2014/0175471 A1* | 6/2014 | Akimoto | ............... | H01L 27/156 257/91 |

* cited by examiner

*Primary Examiner* — Michael Carter
*Assistant Examiner* — Mohammed R Alam
(74) *Attorney, Agent, or Firm* — Syncoda LLC; Feng Ma; Junjie Feng

(57) ABSTRACT

A flip-chip high-voltage light-emitting device includes: a light emitting module composed of a plurality of flip-chip light emitting units in series with a first surface and a second surface opposite to each other, wherein, gap is formed between flip-chip light emitting units, and each comprises an n-type semiconductor layer, a light emitting layer and a p-type semiconductor layer; a light conversion layer on the first surface of the light emitting module that covers side surfaces of light emitting units; an insulation layer that covers the second surface of the entire light emitting module and is only exposed to the n-type semiconductor layer in the first light emitting unit and the p-type semiconductor layer in the last light emitting unit of the light emitting module; a first support electrode and a second support electrode on the insulation layer.

15 Claims, 8 Drawing Sheets

(51) Int. Cl.
*H01L 33/50* (2010.01)
*H01L 33/44* (2010.01)
*H01L 33/60* (2010.01)
*H01L 33/62* (2010.01)

(52) U.S. Cl.
CPC ............ *H01L 33/502* (2013.01); *H01L 33/60* (2013.01); *H01L 33/62* (2013.01); *H01L 2933/0025* (2013.01); *H01L 2933/0041* (2013.01); *H01L 2933/0058* (2013.01); *H01L 2933/0066* (2013.01); *H01L 2933/0075* (2013.01)

(58) Field of Classification Search
CPC ..... H01L 2933/0058; H01L 2933/0041; H01L 2933/0025; H01L 2933/0075; H01L 2933/0066
See application file for complete search history.

FLIP-CHIP HIGH-VOLTAGE LIGHT EMITTING DEVICE AND FABRICATION METHOD

CROSS-REFERENCE TO RELATED APPLICATIONS

The present application is a continuation of, and claims priority to, PCT/CN2015/078570, filed May 8, 2015, which claims priorities to Chinese Patent Application No. CN 201410735775.3, filed Dec. 8, 2014. The disclosures of the above applications are hereby incorporated by reference in their entirety.

BACKGROUND

Light emitting diodes (LEDs), owing to their long service life, high efficiency, low energy consumption and small size, are widely applied in daily life and tend to be important products in modern lighting development.

For LED chips with non-conductive substrates, e.g., sapphire, thermal conductivity of the substrates is low, resulting in high temperature of PN junctions in lateral LEDs. To solve heat dissipation, a flip-chip structure with improving light emitting efficiency is proposed. To further solve light extraction, the flip-chip structure substrate is further lifted off to form a thin film flip chip. As applications develop, to improve chips' photoelectric conversion efficiency, new attempt is made to combine high-voltage chip structures and thin-film flip chips.

SUMMARY

The present disclosure relates to a light-emitting device combining a high-voltage chip and thin film flip chip and the fabrication method thereof.

According to the first aspect of the present disclosure, a flip-chip high-voltage light-emitting device is provided, comprising: a light emitting module composed of a plurality of flip-chip light emitting units in series with a first surface and a second surface opposite to each other, wherein, gap is formed between flip-chip light emitting units, and each comprises an n-type semiconductor layer, a light emitting layer and a p-type semiconductor layer; a light conversion layer on the first surface of the light emitting module that covers side surfaces of light emitting units; an insulation layer that covers the second surface of the entire light emitting module and is only exposed to the n-type semiconductor layer in the first light emitting unit and the p-type semiconductor layer in the last light emitting unit of the light emitting module; a first support electrode and a second support electrode on the insulation layer, which are electrically separated from each other, wherein the first support electrode is electrically connected to the n-type semiconductor layer in the first light emitting unit of the light emitting module, and the second support electrode is electrically connected to the p-type semiconductor layer in the last light emitting unit of the light emitting module.

In some embodiments, the flip-chip high-voltage light-emitting device also comprises a metal reflective layer between the insulation layer and the first and the second support electrodes, which is divided into a first portion and a second portion, wherein the first portion connects to the first support electrode and the second portion connects to the second support electrode; electrode connection regions are formed at ends of the first and the second portions, which are not covered by the insulation layer.

In some embodiments, a metal connection layer is formed between the second surface of the light emitting module and the insulation layer to connect flip-chip light emitting units in series. In some preferred embodiments, the metal connection layer is made of reflective material. In some more preferred embodiments, a light conversion layer is filled between the gap between the flip-chip light emitting units and directly covers the metal connection layer.

In some embodiments, the first and the second support electrodes are made of metal materials with good heat dissipation.

In some embodiments, the first and the second support electrodes are multi-layer structures comprising a reflective layer.

According to the second aspect of the present disclosure, a fabrication method for flip-chip high-voltage light-emitting devices, comprising: 1) providing a light emitting epitaxial structure with a first surface and a second surface opposite to each other, comprising an n-type semiconductor layer, a light emitting layer and a p-type semiconductor layer, wherein, one side of the n-type semiconductor layer is a first surface, and one side of the p-type semiconductor layer is a second surface; 2) etching parts of the p-type semiconductor layer and the light emitting layer of the light emitting epitaxial structure and exposing parts of the n-type semiconductor layer surface to divide the p-type semiconductor layer and the light emitting layer of the light emitting epitaxial structure into a series of units; 3) connecting the p-type semiconductor layers of each unit to the adjacent n-type semiconductor layers to form the light emitting epitaxial structure into a parallel electric structure; 4) fabricating an insulation layer, which covers the second surface of the light emitting epitaxial structure and is only exposed to the n-type semiconductor layer at the first end and the p-type semiconductor layer at the last end of the light emitting epitaxial structure; 5) forming a first support electrode and a second support electrode electrically separated from each other on the insulation layer, wherein, the first support electrode is electrically connected to the n-type semiconductor layer at the first end of the light emitting epitaxial structure and the second support electrode is electrically connected to the p-type semiconductor layer at the last end of the light emitting epitaxial structure; 6) etching the n-type semiconductor layer of the light emitting epitaxial structure to divide the structure into a series of light emitting units in serial connection to form a light emitting module; and 7) fabricating a light conversion layer on the first surface of the light emitting epitaxial structure which covers side surfaces of each light emitting unit.

In this fabrication method, firstly, make a parallel structure with the entire n-type semiconductor layer, which can also be used as support, for lift-off of the epitaxial growth substrate and roughening of the n-type semiconductor layer, and then etch an n-type semiconductor layer to form a serial structure.

In some embodiments, in step 3), fabricate a metal connection layer, which connects the p-type semiconductor layers of each unit to adjacent n-type semiconductor layers. Preferably, the light conversion layer formed in step 7) is directly covered on the metal connection layer.

In some embodiments, after step 4), firstly fabricate a metal reflective layer on the insulation layer surface, and then fabricate a first support electrode and a second support electrode on the metal reflective layer, wherein, the metal reflective layer is divided into a first portion and a second portion electrically separated from each other, in which, the first portion is electrically connected to the n-type semiconductor layer at the first end and the second portion is electrically connected to the p-type semiconductor layer at the last end of the light emitting epitaxial structure.

In another aspect, a light-emitting system is provided including a plurality of the light-emitting devices described above. The light-emitting system can be used, for example, in lighting, displays, signage, etc.

The other features and advantages of this present disclosure will be described in detail in the following specification, and it is believed that such features and advantages will become more obvious in the specification or through implementations of this invention.

Figure 1:
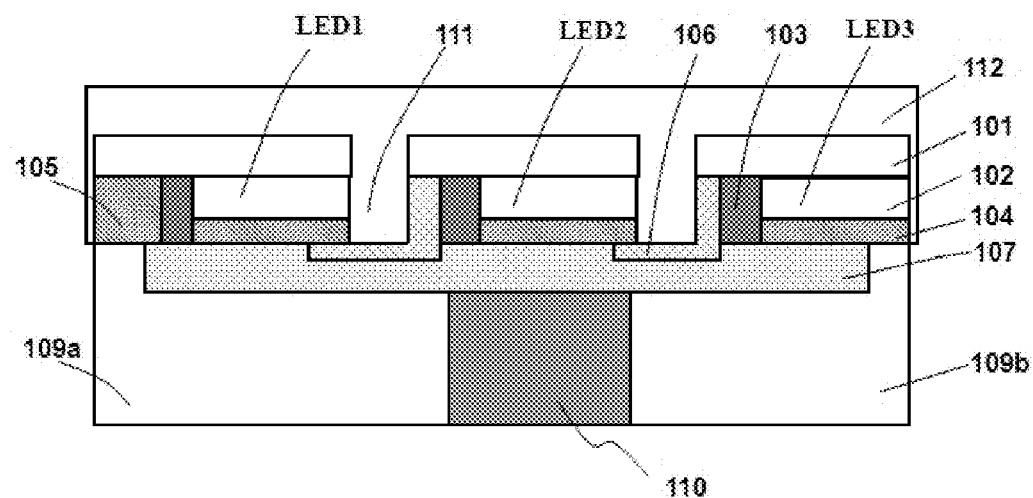
FIG. 1 is a side sectional view of a flip-chip high-voltage light-emitting device according to a first preferred embodiment of the present disclosure.

In the drawings:
100: sapphire substrate; 101: n-type semiconductor layer; 102: p-type semiconductor layer and light emitting layer; 103: transparent insulation material; 104: P electrode layer; 105: N electrode; 106: metal connection layer; 107: transparent insulation material; 108: reflective metal layer; 108*a*: first portion of the reflective metal layer; 108*b*: second portion of the reflective metal; 109*a*: first support electrode; 109*b*: second support electrode; 110: filling material; 111: gap; 112: phosphor; 113: n electrode region; 114: separation region; 115: etching region.

DETAILED DESCRIPTION

The present disclosure will be described in detail with reference to the embodiments and accompany drawings.

FIG. 1 discloses a first preferred embodiment of the present disclosure. Referring to FIG. 1, a flip-chip high-voltage light-emitting device is provided, comprising a plurality of flip-chip light emitting units (For simplification, FIG. 1 only illustrates three light emitting units, LED1, LED2 and LED3. However, in actual conditions, number of light emitting units can be selected based on applications) in serial connection to form a light emitting module; a light conversion layer 112 on the upper surface of the light emitting module; a transparent insulation layer 107 on the lower surface of the light emitting module; and a first support electrode 109*a* and a second support electrode 109*b* on the transparent insulation layer 107.

Specifically, gap 111 is formed between flip-chip light emitting units of the light emitting module, each comprising an n-type semiconductor layer 101, a light emitting module and a p-type semiconductor layer 102. A p electrode layer 104 is formed on the surface of the p-type semiconductor layer 102 of each light emitting unit, and an n electrode 105 is formed on the n-type semiconductor layer 101 of the first light emitting unit LED1, wherein, light emitting units of the light emitting module are connected through a metal connection layer 106, which is at the bottom of gap 111; the p electrode layer 104, then electrode 105 and the metal connection layer 106 have good reflective property, preferably made of Ni/Ag/Ti/Pt or any alloy composed of Cr, Al, Co, Cu, Sn and Au. A light conversion layer 112 is filled in the gap 111 of the light emitting units, which directly covers the metal connection layer 106 and covers side surfaces of each light emitting unit, thus forming a wrapped shape on the epitaxial structure of the light emitting module. A transparent insulation layer 107 covers the lower surface of the entire light emitting module and is only exposed to the n electrode 105 of the first light emitting unit LED1 and the p electrode layer 104 of the last light emitting unit LED3 of the light emitting module; the first support electrode 109*a* is connected to the n electrode 105 of the first light emitting unit LED1 and the second support electrode 109*b* is connected to the p electrode layer 104 of the last light emitting unit LED3. The first support electrode 109*a* and the second support electrode 109*b* are electrically separated by filling material 110, which can be insulation materials like organic photoresist, silicon dioxide, silicon nitride, SOG, organic resin electric insulation sealant, and its height is preferably not lower than 95% of the support electrode height.

In this embodiment, light emitting units of the light emitting module emit blue light, which is changed to white light through the light conversion layer. Side leakage of blue light can be avoided because side walls of each light emitting unit are wrapped by a light wavelength conversion layer 112. Further, the p electrode layer 104, the n electrode 105 and the metal connection layer 106 have good reflectivity, thus completely reflecting the light of the lower surface of each light emitting unit.

Figure 2:
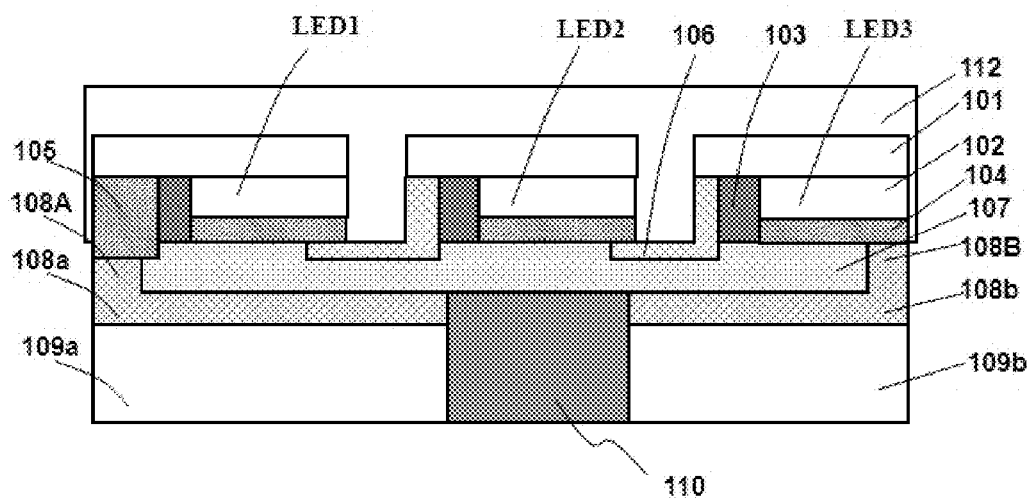
FIG. 2 is a side sectional view of a flip-chip high-voltage light-emitting device according to a first preferred embodiment of the present disclosure.

FIG. 1 discloses a second preferred embodiment of the present disclosure. Referring to FIG. 2, the flip-chip high-voltage light-emitting device also comprises a metal reflective layer 108 between the transparent insulation layer 107 and the support electrodes; the metal reflective layer 108 covers to the separation region 114 between the light emitting units, which is divided into a first portion 108a and a second portion 108b, wherein, the first portion 108a connects to the first support electrode 109a and the second portion 108b connects to the second support electrode 109b; electrode connection regions 108A and 108B are formed at ends of the first and the second portions, which are not covered by the insulation layer; the electrode connection region 108A in the first portion 108a is connected to the n electrode 105 of the first light emitting unit LED1, and the electrode connection region 108B in the second portion 108b is connected to the p electrode layer 104 of the last light emitting unit LED3; in this embodiment, the p electrode layer 104 mainly serves as a current spreading layer, which can be made of non-reflective layer and the transparent insulation layer 107 is made of material with low refractive index, which constitutes an omni-directional reflector with the metal reflective layer 108.

FIGS. 3-14 illustrate a fabrication method for a flip-chip high-voltage light-emitting device according to the present disclosure. Details will be given in combination with accompanying drawings.

Figure 3:
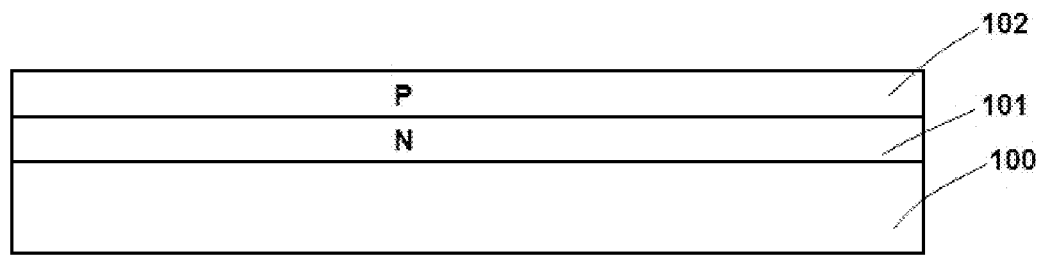
FIG. 3 illustrates a first step of a fabrication method for a flip-chip high-voltage light-emitting device according to some embodiments.

Referring to FIG. 3, provide a light emitting epitaxial structure, comprising a sapphire substrate 100, an n-type semiconductor layer 101, a light emitting layer and a p-type semiconductor layer 102.

Figure 4:
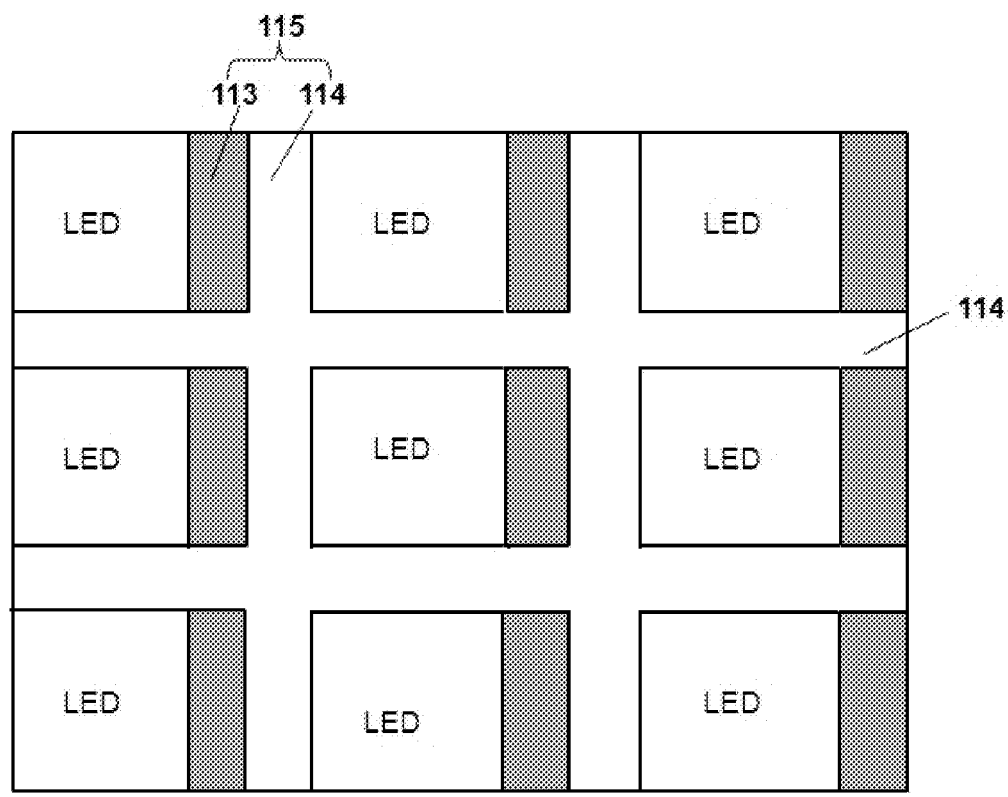
FIG. 4 illustrates a second step of a fabrication method for a flip-chip high-voltage light-emitting device according to some embodiments.
Figure 5:
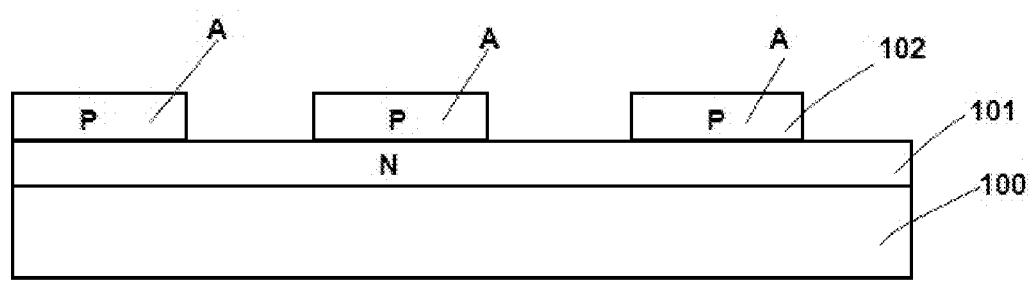
FIG. 5 illustrates a third step of a fabrication method for a flip-chip high-voltage light-emitting device according to some embodiments.

Referring to FIG. 4, determine an etching region 115 on the surface of the light emitting epitaxial structure, which comprises an n electrode region 113 and a separation region 114, wherein, the separation region 114 divides the entire light emitting epitaxial structure into a series of light emitting units LEDs, and the n electrode region 113 is close to the separation region 114. Etch the p-type semiconductor layer in the etching region 115 and the light emitting layer 102 of the light emitting epitaxial structure and expose the surface of the n-type semiconductor layer 101. Referring to FIG. 5, the p-type semiconductor layer and the light emitting layer 102 of the light emitting epitaxial structure are divided into a series of units A.

Figure 6:
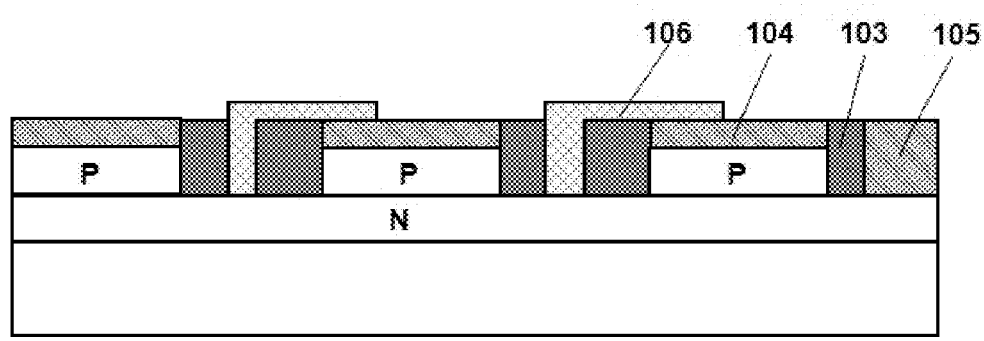
FIG. 6 illustrates a fourth step of a fabrication method for a flip-chip high-voltage light-emitting device according to some embodiments.

Referring to FIG. 6, fabricate the p electrode layer 104 on the surface of the p-type semiconductor layer of each unit A and cover transparent insulation material 103 on the exposed n-type semiconductor layer 101 surface; and fabricate an n electrode 105 and a metal connection layer 106 by drilling to form units A of the entire light emitting epitaxial structure into a parallel structure.

Figure 7:
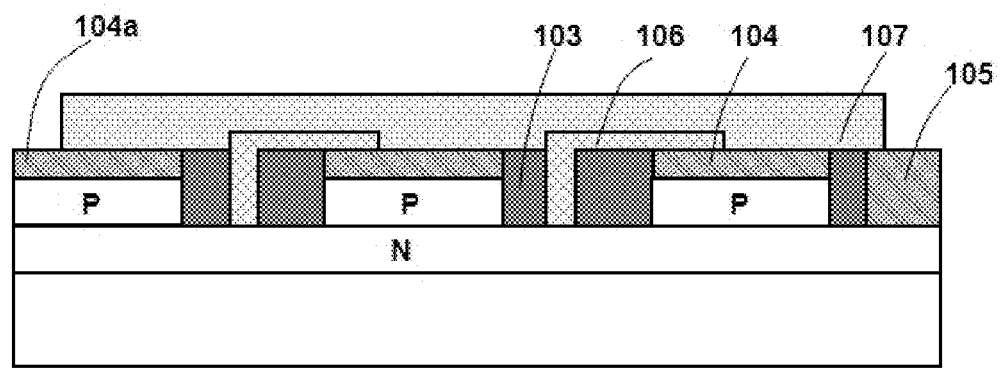
FIG. 7 illustrates a fifth step of a fabrication method for a flip-chip high-voltage light-emitting device according to some embodiments.

Referring to FIG. 7, cover a transparent insulation layer 107 on the surface of entire light emitting epitaxial structure and only expose parts of the surfaces of the n electrode 105 at the first end and the p electrode layer 104a at the last end of the light emitting epitaxial structure.

Figure 8:
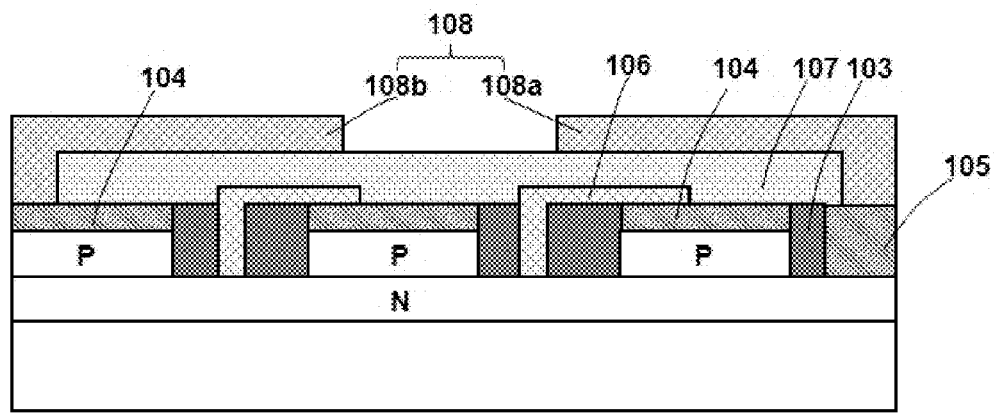
FIG. 8 illustrates a sixth step of a fabrication method for a flip-chip high-voltage light-emitting device according to some embodiments.

Referring to FIG. 8, fabricate a metal reflective layer 108 on the insulation layer, which covers to the separation region 114 between light emitting units and is divided into a first portion 108a and a second portion 108b electrically separated from each other, wherein, the first portion 108a connects to the n electrode 105 at first end and the second portion 108b connects to the p electrode layer 104a at last end of the light emitting epitaxial structure.

Figure 9:
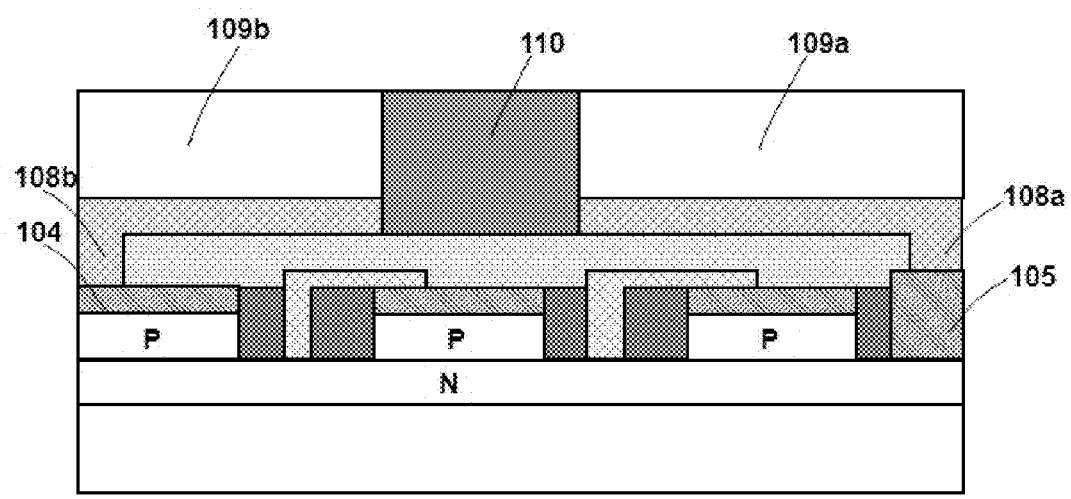
FIG. 9 illustrates a seventh step of a fabrication method for a flip-chip high-voltage light-emitting device according to some embodiments.

Referring to FIG. 9, electroplate a first support electrode 109a and a second support electrode 109b on the metal reflective layer 108 which is preferably made of Cu and is 50 μm-500 μm thick; fill in insulation material 110 between the first and the second support electrodes, wherein, the first support electrode 109a connects to the first portion 108a of the metal reflective layer and the second support electrode 109b connects to the second portion 108b of the metal reflective layer.

Figure 10:
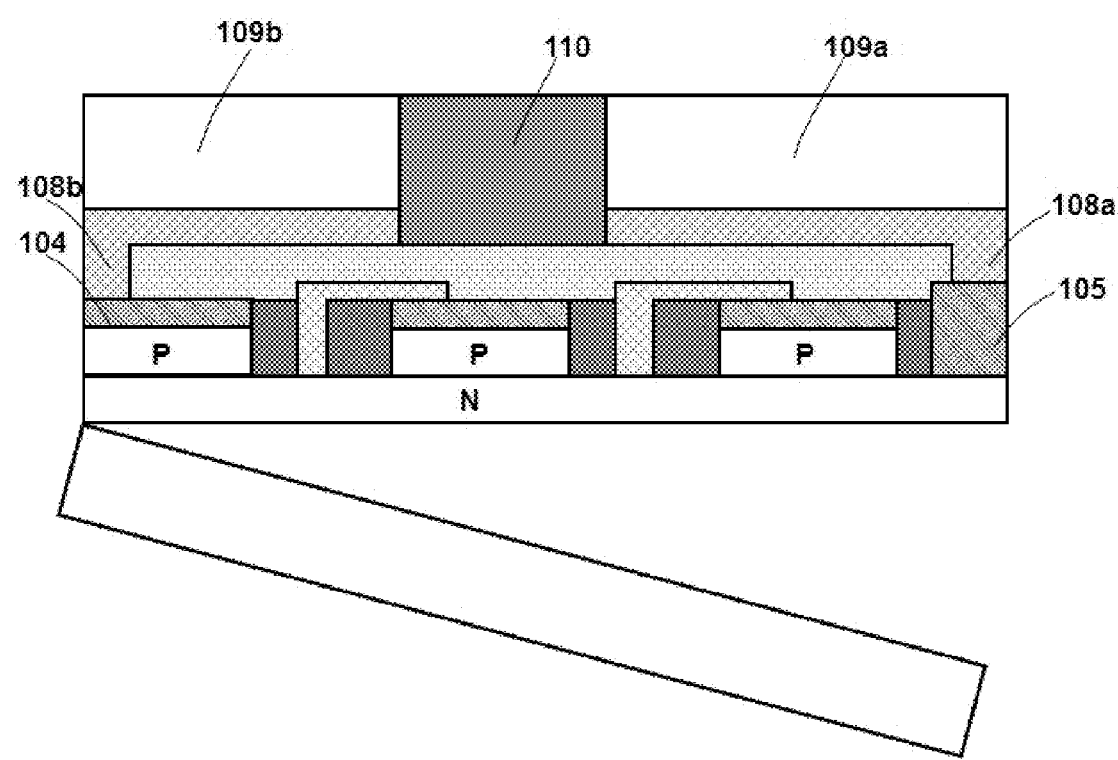
FIG. 10 illustrates an eighth step of a fabrication method for a flip-chip high-voltage light-emitting device according to some embodiments.

Referring to FIG. 10, remove the sapphire substrate 100 through laser lift-off and clean the surface with hydrochloric acid.

Figure 11:
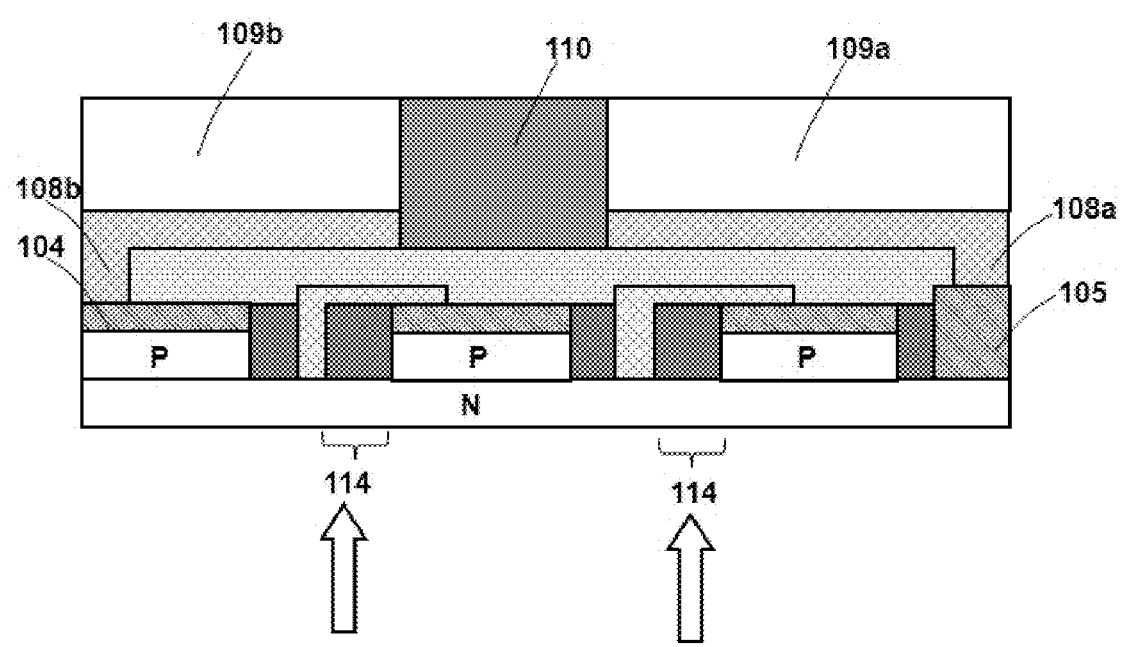
FIG. 11 illustrates a ninth step of a fabrication method for a flip-chip high-voltage light-emitting device according to some embodiments.
Figure 12:
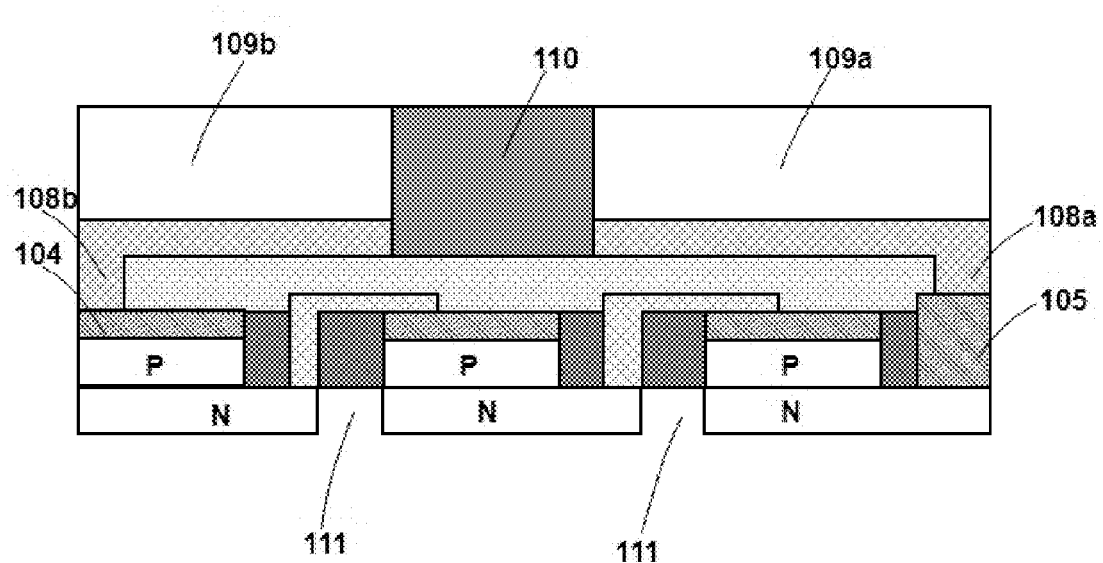
FIG. 12 illustrates a tenth step of a fabrication method for a flip-chip high-voltage light-emitting device according to some embodiments.

Referring to FIGS. 11-12, etch the n-type semiconductor layer 101 of the separation region 114 of the light emitting epitaxial structure from back and expose the transparent insulation material 103 at bottom. The entire light emitting epitaxial structure is divided into a series of light emitting units in serial connection to form a light emitting module and gap 111 is formed between units.

Figure 13:
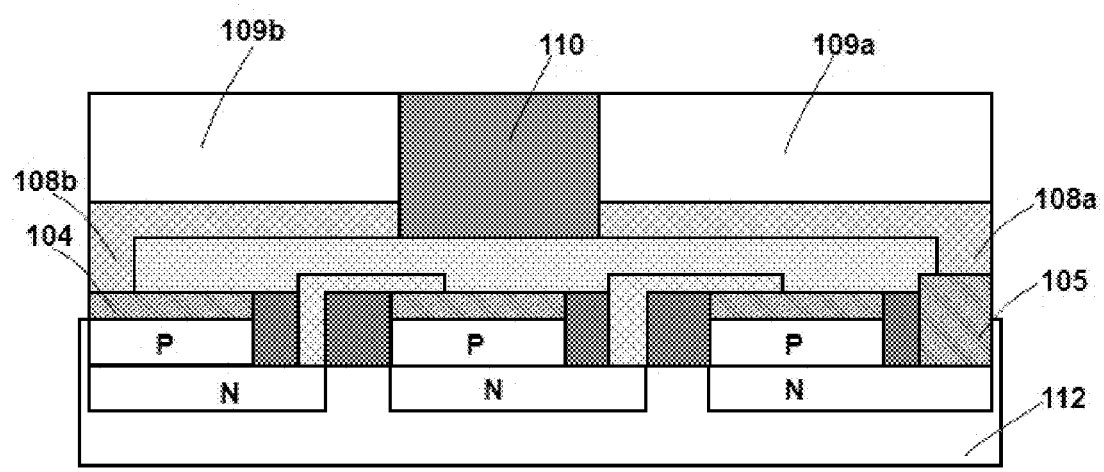
FIG. 13 illustrates an eleventh step of a fabrication method for a flip-chip high-voltage light-emitting device according to some embodiments.

Referring to FIG. 13, the n-type semiconductor surface of the entire light emitting module is covered with a light conversion layer 112, which fills in gap 111 of units and covers the side surfaces of the epitaxial structures of each light emitting unit.

Compared with the flip-chip high-voltage light-emitting devices of the prior art where high-voltage serial chips are made firstly, in this present disclosure, in fabricating the metal connection layer, only etch to the n-type semiconductor layer and form a parallel structure through the n-type semiconductor layer; at the same time, material is filled under the support of the entire n-type semiconductor layer, which avoids breaking of the metal connection layer due to stress relief from laser lift-off of the growth substrate; after substrate removal, remove the n-type semiconductor layer in the separation region to form a serial structure, thus prevent the insulation material from filling in deep wells and avoiding breaking of the metal connection layer.

Figure 14:
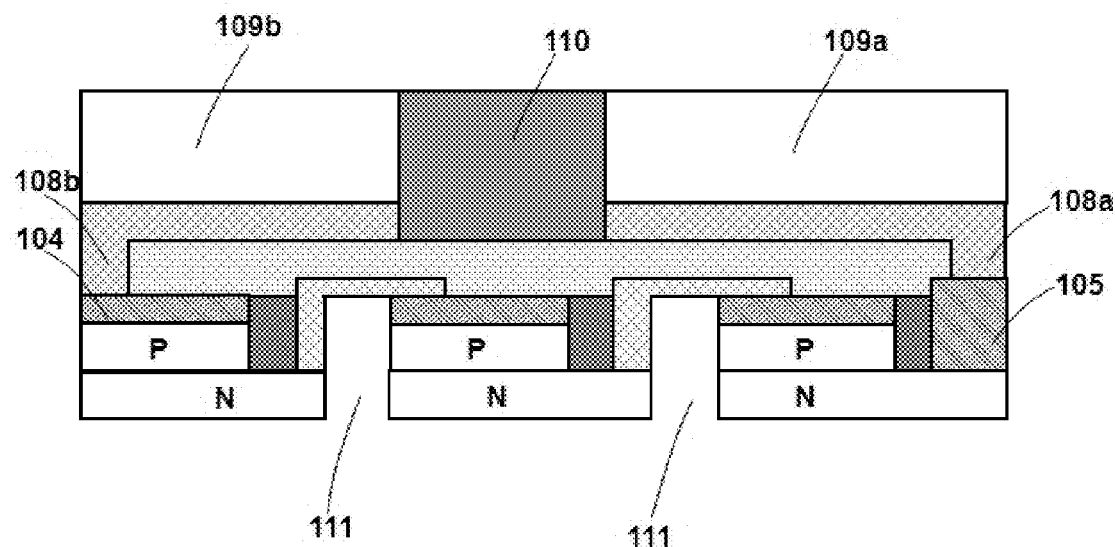
FIG. 14 illustrates a step of a fabrication method for a flip-chip high-voltage light-emitting device according to some other embodiments.
Figure 15:
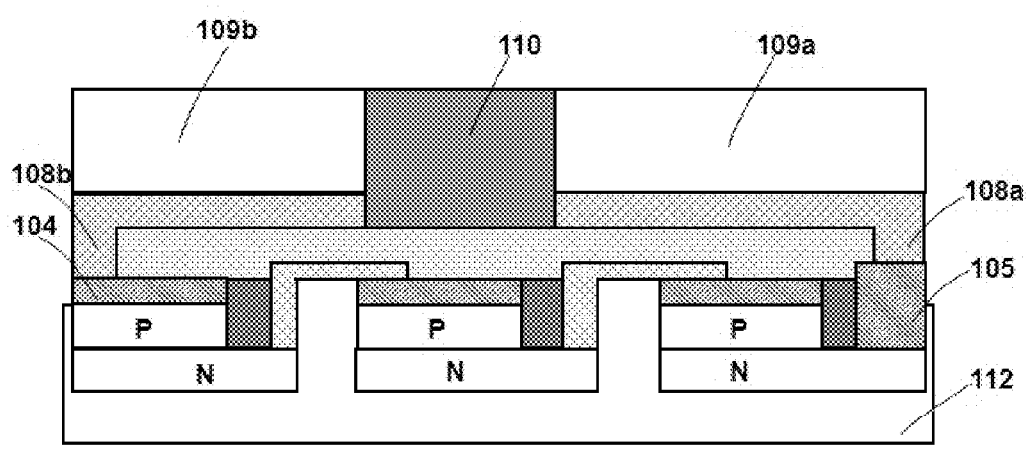
FIG. 15 illustrates another step of a fabrication method for a flip-chip high-voltage light-emitting device according to the other embodiments.

FIGS. 14-15 illustrate a fabrication method of another flip-chip high-voltage light-emitting device according to the present disclosure. Firstly, form a structure as shown in FIG. 12 following the steps aforesaid; further etch the transparent insulation material 103 in the separation region 114 and expose the metal connection layer 106 to form a deeper-structure channel. Refer to FIG. 14 for the structure.

Referring to FIG. 15, the n-type semiconductor surface of the entire light emitting module is covered with a light conversion layer 112, which fills in gap 111 of units and covers the side surfaces of the epitaxial structures of each light emitting unit.

In this embodiment, remove the insulation material in the separation region 114 and expose the metal connection layer to improve reflectivity and light extraction efficiency. In high-voltage thin-film flip chips of the prior art, after laser lift-off, the bottom is a plane structure. However, in this embodiment, after laser lift-off, a groove structure is formed after dry etching of serial chips. After covering and filling of the fluorescent layer, the chip epitaxy is formed in a wrapped shape. That means, a white light chip is formed at chip level and avoids side leakage of blue light.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A flip-chip high-voltage light-emitting device, comprising:
   a light emitting module comprising a plurality of flip-chip light emitting units in series, wherein the light emitting module has a first and a second opposing surfaces, wherein gaps are formed among the plurality of flip-chip light emitting units, and each unit comprising an n-type semiconductor layer, a light emitting layer, and a p-type semiconductor layer;
   a light conversion layer over the first surface of the light emitting module and covering side surfaces of the plurality of light emitting units;
   an insulation layer covering the second surface of the entire light emitting module except the n-type semiconductor layer of a first light emitting unit of the plurality of light emitting units, and the p-type semiconductor layer in a last light emitting unit of the plurality of light emitting units;
   a first support electrode and a second support electrode over the insulation layer and electrically separated from each other, wherein the first support electrode is electrically connected to the n-type semiconductor layer of the first light emitting unit, and the second support electrode is electrically connected to the p-type semiconductor layer in the last light emitting unit.

2. The flip-chip high-voltage light-emitting device of claim 1, further comprising a metal reflective layer disposed between the insulation layer and the first and the second support electrodes and covering the gaps, wherein the metal reflective layer comprises a first portion and a second portion, wherein the first portion connects to the first support electrode and the second portion connects to the second support electrode; electrode connection regions are formed at ends of the first and the second portions and are not covered by the insulation layer.

3. The flip-chip high-voltage light-emitting device of claim 1, further comprising a metal connection layer formed between the second surface of the light emitting module and the insulation layer to connect the plurality of flip-chip light emitting units in series.

4. The flip-chip high-voltage light-emitting device of claim 3, wherein: the metal connection layer is made of a reflective material.

5. The flip-chip high-voltage light-emitting device of claim 3, wherein: the light conversion layer is filled in the gaps and directly covers the metal connection layer.

6. A method of fabricating a flip-chip high-voltage light-emitting device, the method comprising:
   (1) providing a light emitting epitaxial structure with a first and a second opposing surfaces, comprising an n-type semiconductor layer, a light emitting layer, and a p-type semiconductor layer, wherein a side of the n-type semiconductor layer is the first surface, and a side of the p-type semiconductor layer is the second surface;
   (2) etching portions of the p-type semiconductor layer and the light emitting layer of the light emitting epitaxial structure and exposing portions of the n-type semiconductor layer surface to divide the p-type semiconductor layer and the light emitting layer of the light emitting epitaxial structure into a plurality of units;
   (3) connecting the p-type semiconductor layers of the plurality of units to the adjacent n-type semiconductor layers to form the light emitting epitaxial structure into a parallel electric structure;
   (4) fabricating an insulation layer covering the second surface of the light emitting epitaxial structure and only exposing to the n-type semiconductor layer at a first end and the p-type semiconductor layer at a last end of the light emitting epitaxial structure;
   (5) forming a first support electrode and a second support electrode electrically separated from each other on the insulation layer, wherein the first support electrode is electrically connected to the n-type semiconductor layer at the first end of the light emitting epitaxial structure and the second support electrode is electrically connected to the p-type semiconductor layer at the last end of the light emitting epitaxial structure;
   (6) etching portions of the n-type semiconductor layer of the light emitting epitaxial structure to divide the structure into a plurality of flip-chip light emitting units in serial connection to form a light emitting module; and
   (7) fabricating a light conversion layer on the first surface of the light emitting epitaxial structure covering side surfaces of each flip-chip light emitting unit;
   herein the fabricated flip-chip high-voltage light-emitting device comprises:
   the light emitting module comprising the plurality of flip-chip light emitting units in series, wherein the light emitting module has the first and the second opposing surfaces, wherein gaps are formed among the plurality of flip-chip light emitting units, and each flip-chip light emitting unit comprising the n-type semiconductor layer, the light emitting layer, and a p-type semiconductor layer;
   the light conversion layer over the first surface of the light emitting module and covering side surfaces of the plurality of light emitting units;
   the insulation layer covering the second surface of the entire light emitting module except the n-type semiconductor layer of the first flip-chip light emitting unit of the plurality of flip-chip light emitting units, and the p-type semiconductor layer in the last flip-chip light emitting unit of the plurality of flip-chip light emitting units;
   the first support electrode and the second support electrode over the insulation layer and electrically separated from each other, wherein the first support electrode is electrically connected to the n-type semiconductor layer of the first light emitting unit, and the second support electrode is electrically connected to the p-type semiconductor layer in the last light emitting unit.

7. The method of claim 6, further comprising making a parallel structure with the entire n-type semiconductor layer.

8. The method of claim 6, wherein step (3) further comprises fabricating a metal connection layer connecting the p-type semiconductor layers of the plurality of flip-chip light emitting units to adjacent n-type semiconductor layers.

9. The method of claim 8, wherein the light conversion layer formed in step (7) is directly covered on the metal connection layer.

10. The method of claim 6, further comprising, after step (4), fabricating a metal reflective layer on the insulation layer surface, and then fabricating the first support electrode and the second support electrode on the metal reflective layer, wherein, the metal reflective layer comprises a first portion and a second portion electrically separated from each other, wherein the first portion is electrically connected to the n-type semiconductor layer at the first end and the second portion is electrically connected to the p-type semiconductor layer at the last end of the light emitting epitaxial structure.

11. A light-emitting system comprising a plurality of flip-chip high-voltage light-emitting devices, each device comprising:
a light emitting module comprising a plurality of flip-chip light emitting units in series, wherein the light emitting module has a first and a second opposing surfaces, wherein gaps are formed among the plurality of flip-chip light emitting units, and each unit comprising an n-type semiconductor layer, a light emitting layer, and a p-type semiconductor layer;
a light conversion layer over the first surface of the light emitting module and covering side surfaces of the plurality of light emitting units;
an insulation layer covering the second surface of the entire light emitting module except the n-type semiconductor layer of a first light emitting unit of the plurality of light emitting units, and the p-type semiconductor layer in a last light emitting unit of the plurality of light emitting units;
a first support electrode and a second support electrode over the insulation layer and electrically separated from each other, wherein the first support electrode is electrically connected to the n-type semiconductor layer of the first light emitting unit, and the second support electrode is electrically connected to the p-type semiconductor layer in the last light emitting unit.

12. The system of claim 11, wherein each device further comprises a metal reflective layer disposed between the insulation layer and the first and the second support electrodes and covering the gaps, wherein the metal reflective layer comprises a first portion and a second portion, wherein the first portion connects to the first support electrode and the second portion connects to the second support electrode; electrode connection regions are formed at ends of the first and the second portions and are not covered by the insulation layer.

13. The system of claim 11, wherein each device further comprises a metal connection layer formed between the second surface of the light emitting module and the insulation layer to connect the plurality of flip-chip light emitting units in series.

14. The system of claim 13, wherein the metal connection layer is made of a reflective material.

15. The system of claim 13, wherein the light conversion layer is filled in the gaps and directly covers the metal connection layer.

* * * * *